United States Patent [19]

Torrano et al.

[11] Patent Number: 4,968,949
[45] Date of Patent: Nov. 6, 1990

[54] OHMICALLY ISOLATING INPUT CIRCUIT

[75] Inventors: Michael A. Torrano, Albany; John D. Meyer, Berkeley; Bill Hemsath; Felicity Seidel, both of Oakland, all of Calif.

[73] Assignee: Meyer Sound Laboratories Incorporated, Berkeley, Calif.

[21] Appl. No.: 258,393

[22] Filed: Oct. 17, 1988

Related U.S. Application Data

[63] Continuation-in-part of Ser. No. 890,691, Jul. 25, 1986, Pat. No. 4,779,058.

[51] Int. Cl.$^5$ .............................................. H03F 3/00
[52] U.S. Cl. .................................... 330/188; 330/190
[58] Field of Search .............. 330/124 D, 124 R, 188, 330/189, 190, 295, 69

[56] References Cited
U.S. PATENT DOCUMENTS 4,270,061  5/1981  Gronner et al. ................ 330/188 X
4,779,058  10/1988  Meyer ................................ 330/188

*Primary Examiner*—Steven Mottola
*Attorney, Agent, or Firm*—Donald L. Beeson

[57] ABSTRACT

An ohmically isolating input circuit accepts a three pin connector of a cable from a signal source output for virtually all three pin connector standards, and will output a signal of the same voltage regardless of which of the three pin connector standards are used. In one embodiment of the invention, the input circuit includes a center tapped transformer having its tap primary winding side connected to the circuits three input terminals and having its secondary winding side connected directly into the input of an operational amplifier which forces the transformer to operate as a current transformer with virtually no voltage drop across its secondary or primary windings. The output of the operational amplifier, which serves as the output of the input circuit, is fed back to the inverting input of the operational amplifier to provide a high gain negative feedback circuit which converts signal currents from the transformer secondary winding to an output voltage signal. The output voltage signal will be substantially the same regardless of which input terminal pair receives the input voltage, and regardless of whether the unused input terminal is connected to the common terminal.

16 Claims, 5 Drawing Sheets

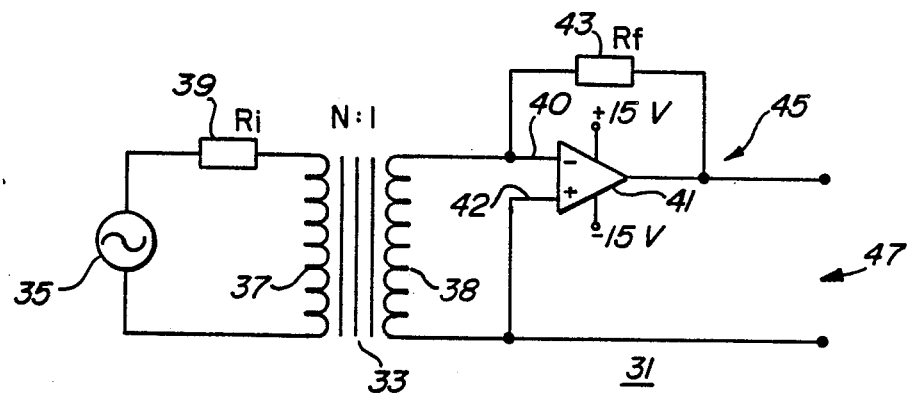
FIG._1

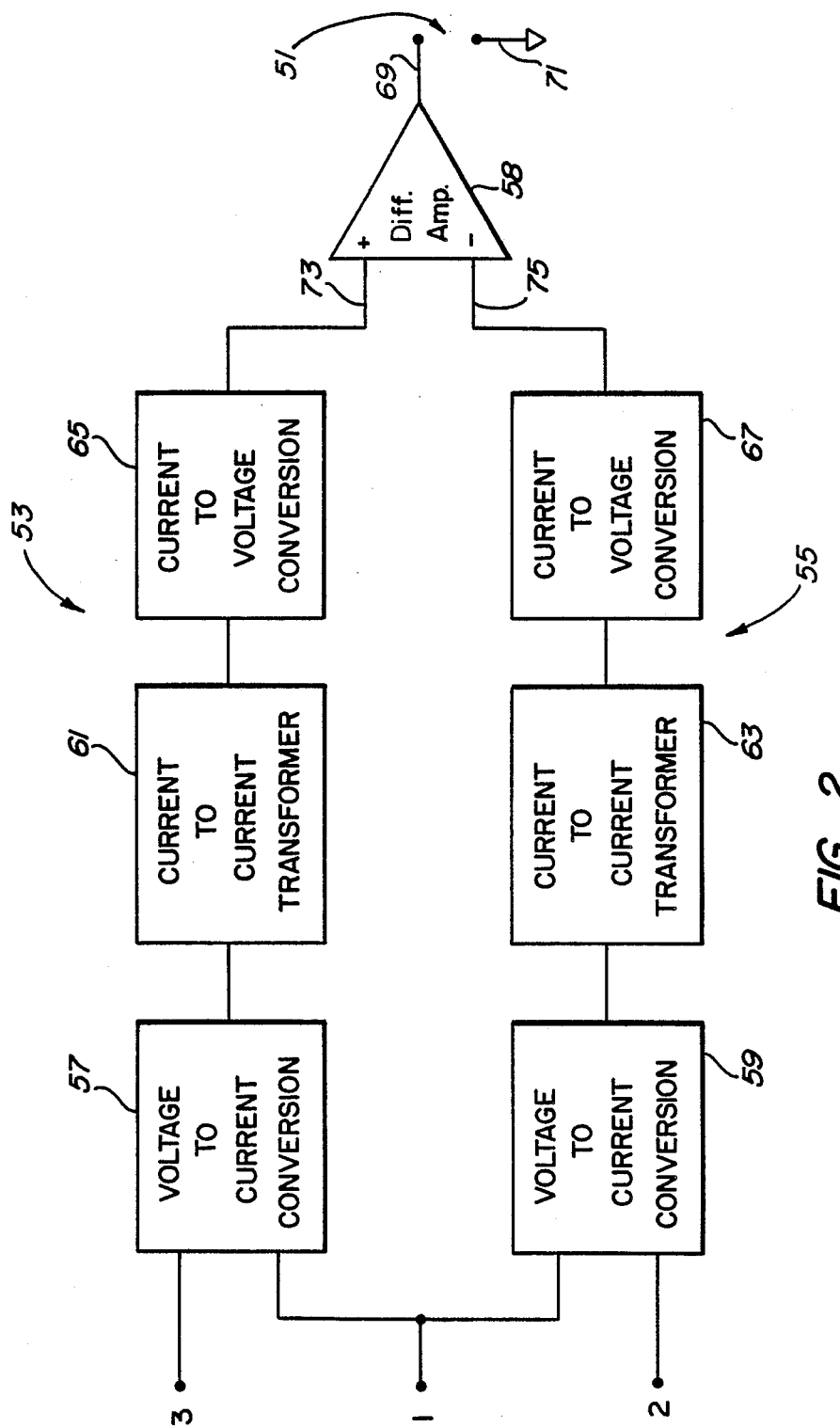
FIG._2

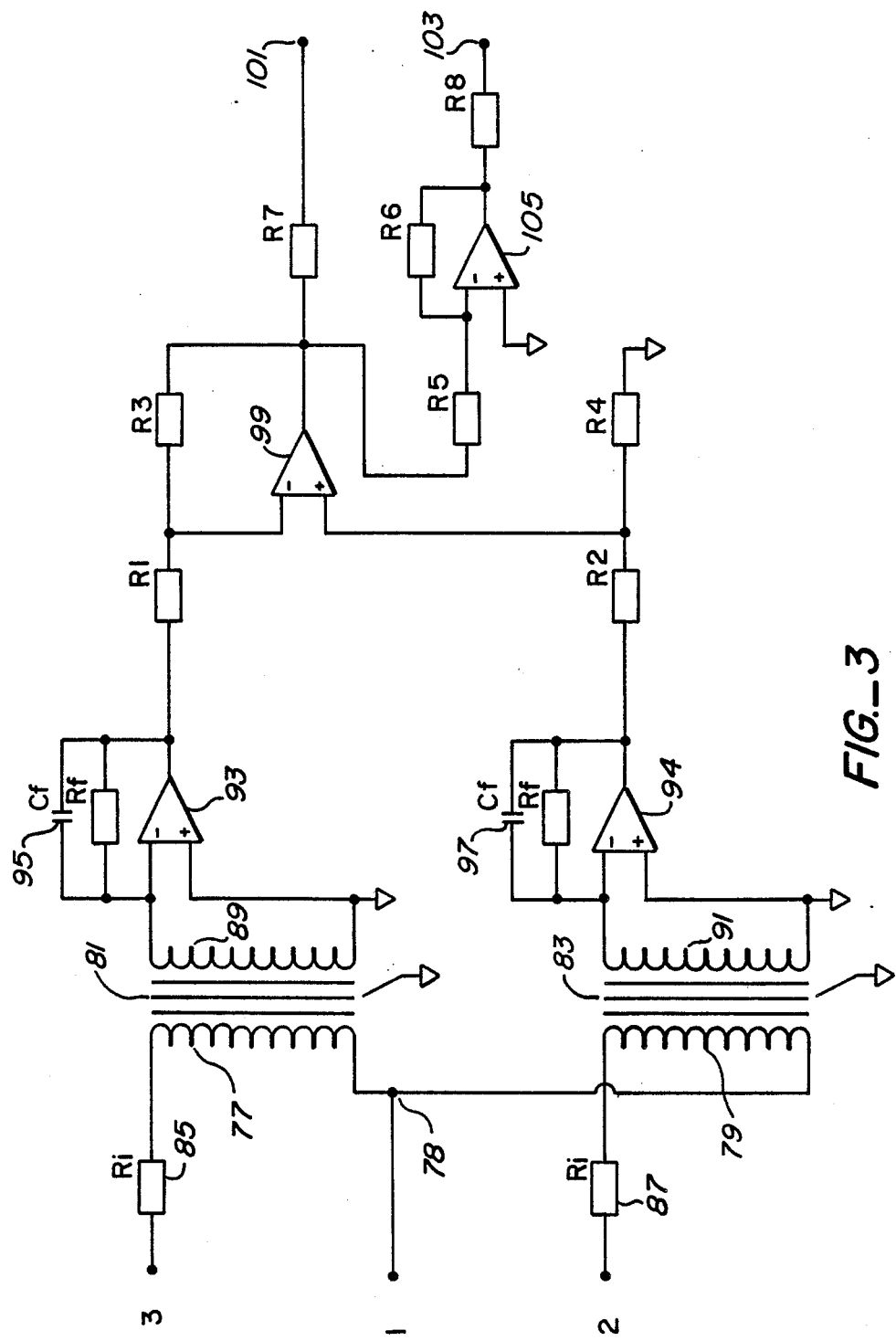
FIG._3

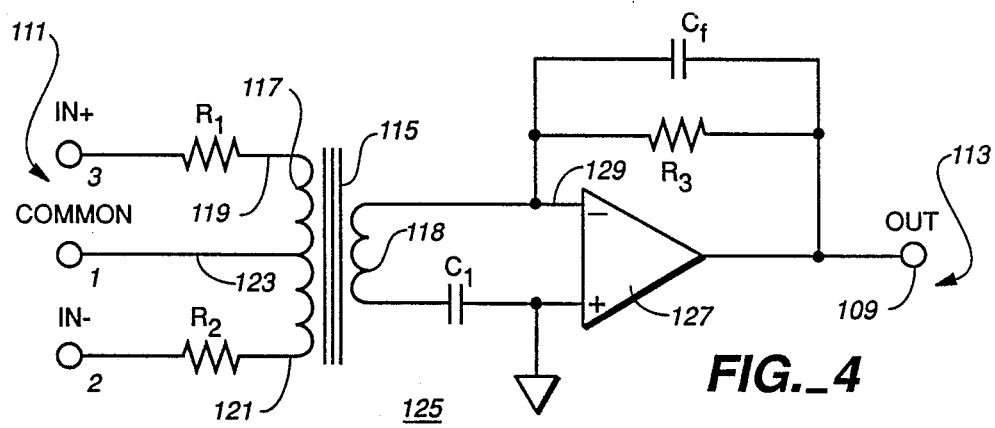
FIG._4
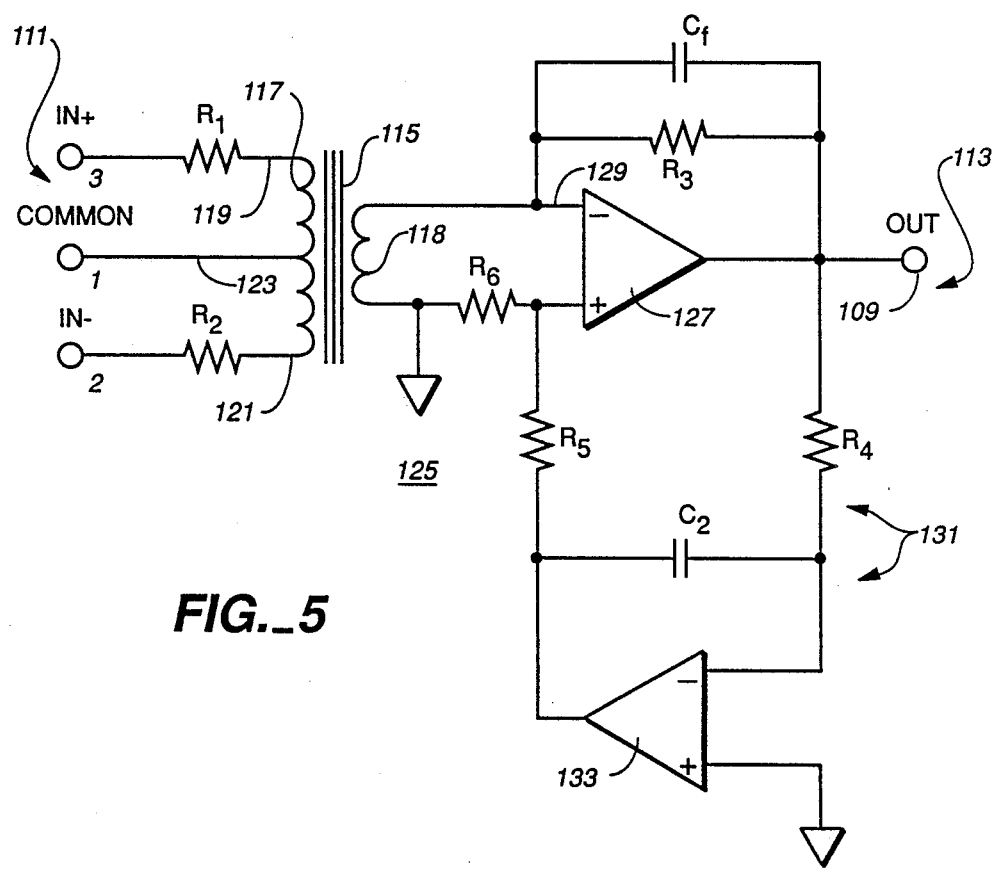
FIG._5

| SIGNAL SOURCE OUTPUT CONFIGURATION | WIRING OF INPUT | | | OUTPUT POLARITY |
|---|---|---|---|---|
| | PIN 1 | PIN 2 | PIN 3 | |
| BALANCED | N/C | − | + | + |
| | N/C | + | − | − |
| | C | − | + | + |
| | C | + | − | − |
| | − | − | + | + |
| | − | + | − | − |
| | − | N/C | + | + |
| | − | + | N/C | − |
| | + | N/C | − | − |
| | + | − | N/C | + |
| UNBALANCED | N/C | C | + | + |
| | N/C | + | C | − |
| | C | C | + | + |
| | C | + | C | − |
| | C | N/C | + | + |
| | + | N/C | C | − |
| | C | + | N/C | − |
| | + | C | N/C | + |

*FIG._6*

OHMICALLY ISOLATING INPUT CIRCUIT

CROSS-REFERENCE TO RELATED APPLICATION

This is a continuation-in-part of application Serial No. 890,691, filed July 25, 1986, Pat. No. 4,779,058.

BACKGROUND OF THE INVENTION

The present invention generally relates to the input stage of signal processing circuits, such as audio amplifiers, and more particularly to input stages of such electronic equipment which use 3-pin input connectors.

A common problem that plagues professional audio systems using patchable 3-circuit connectors is that there is no universal standard for connecting the pins to be used for the signal, signal return, and chassis common. Different manufacturers, especially manufacturers in different countries such as U.S. and European manufacturers, use different pin connections, and the signal source output configuration from one piece of equipment to another will vary widely and include balanced and unbalanced outputs. Consequently, equipment is often cabled together without matching input and output pin configurations causing unexpected signal inversion, unwanted change of gain, and power frequency injection often referred to as "hum" or "rizz."

The present invention overcomes the above-mentioned problems associated with using unmatched 3-circuit connectors by providing a unique input stage circuit that avoids undesirable changes of gain over a wide range of possible input pin connector configurations. The input circuit of the present invention also eliminates power frequency injection by breaking the ohmic connection between the signal source chassis and the chassis of the piece of equipment using the input circuit of the invention.

More specifically, the invention provides an input stage for an amplifier or the like that will accept a signal source output from equipment of most any manufacturer regardless of connector design conventions. Assuming equal input signal drive levels, the output of the input stage, and thus the signal input to the amplifier, will be the same (except for possible reverse polarities) regardless of which two pins see the signal, and regardless of whether the pins are connected to a balanced or unbalanced output. Moreover, using the input circuit of the invention there will be no input connection that will short the output of the signal source (other than connecting the hot pin directly to the input connector shell). The input circuit of the invention will accommodate virtually all 3-pin connector standards and permit the user to employ a variety of types of phase reversing adaptors without fear of shorting out the signal source or suffering in any way a change in gain.

SUMMARY OF THE INVENTION

Ohmic isolation and uniform gain characteristics of an input stage circuit are achieved by an ohmically isolating input circuit in accordance with the invention. The circuit of the invention has an input side and output side and a current transformer coupling means for ohmically isolating the two sides of the circuit. The input side of the circuit includes at least three input terminals for receiving an input signal, typically a voltage signal, across any two of the terminals; the output side of the circuit includes a circuit output for providing an output voltage which corresponds to the input signal. The current transformer coupling means of the invention acts to transformer couple any two of the input terminals to the circuit output such that the signal gain between the input and the output is substantially the same regardless of which two input terminals are selected. By employing current transformer coupling means instead of a voltage transformer, the transformers used in circuits according to the invention are able to operate in the microwatt power range. As a result nonlinearities associated with core eddy losses, hysteresis problems, ringing and phase shift normally associated with audio-transformer designs are substantially reduced.

The invention forces the one or more transformers used in the circuit to operate as current transformers by loading the transformers' secondary winding with a virtually zero impedance load means, that is, by forcing the voltage drop across secondary and therefore the primary windings of the transformer to be essentially zero volts. In the illustrated embodiment, a virtual zero impedance load is provided by means of a high-gain negative feedback circuit means and specifically by an operational amplifier with negative feedback. By connecting the transformer secondary directly into a high-gain, high-negative feedback circuit, the voltage across the secondary winding of the transformer will be kept so small as to be insignificant. This circuit will also act to convert the current signal coupled through the transformer to a voltage signal at the circuit output.

In one conception the current transformer coupling means of the invention two separate, magnetically isolated, series connected transformers are provided for transformer coupling an input voltage signal to the circuit output at substantially the same gain regardless of the input terminal pair receiving the input signal. It has been discovered, however, that the constant gain objective of the invention can be obtained by using only one tapped transformer instead of two separate isolated transformers. It has specifically been found that a tapped transformer, when acting as a current transformer instead of a voltage transformer, can be made to couple input signals through the circuit from different inputs without significant differences in voltage gain at the circuit output. A tapped transformer eliminates the expense of using two transformers and the extra circuitry associated therewith. A single transformer also eliminates the problems encountered in selecting closely matched transformers needed to implement the two transformer version of the invention.

The present invention specifically contemplates the use of a center tapped transformer whereby the signal input to the transformer is applied across either one half or all the turns of the transformer primary. It is also noted that the signal input to any two of the circuit's input terminals is preferably, but not necessarily, a voltage input.

It is further noted that the current gain through the tapped transformer itself is not constant as between different input terminals. The transformer gain will be different for current signals passing through only part of the primary as compared to the current signal passing through the entire primary winding. To counteract this differential in transformer gain, the invention provides means for equalizing the amount of current gain through the transformer. Specifically, in the illustrated embodiment of the invention, resistances are connected in series with the outer leads of the transformer's primary winding to attenuate the current signal passing through the entire primary winding to a greater degree than the current signal flowing through part of the primary winding which occurs when the transformer's tapped lead is used.

It is therefore a primary object of the present invention to provide an input circuit to an audio amplifier or other audio signal processing equipment which will accept a wide variety of input pin connections with no change in gain, and which will provide a transformer coupled input for ohmically isolating the input from the rest of the equipment's circuitry. It is a another object of the invention to provide ohmic isolation with very little distortion by using relatively inexpensive small and lightweight transformers. It is a further object of the invention to implement such an ohmically isolating input circuit using a single tapped transformer. Other objects of the invention will become apparent from the following description of the embodiments of the invention illustrated in the accompanying drawings.

DESCRIPTION OF THE DRAWINGS

FIG. 1 is a schematic drawing of transformer circuit illustrating the operation of a transformer as a current transformer.

FIG. 2 is a block diagram representation of a three terminal input circuit in accordance with the invention using a current-to-current transformer such as shown in FIG. 1 transformer.

FIG. 3 is a schematic illustration of the circuit generally represented in block diagram form in FIG. 2.

FIG. 4 is a schematic diagram of an ohmically isolated input circuit in accordance with the invention using a single center tapped transformer.

FIG. 5 is a schematic diagram of an alternative embodiment of the circuit illustrated in FIG. 5 showing a separate feedback circuit for suppressing the amplification of d.c. offset voltages at the input of the operational amplifier which is connected to the secondary winding side of the circuit's transformer.

FIG. 6 is a table illustrating the polarity output of the input circuit of the invention for a variety of different input pin connections.

DETAILED DESCRIPTION OF ILLUSTRATED EMBODIMENT

Referring now to the drawings, FIG. 1 illustrates a simple transformer coupled circuit, generally denoted 31, wherein the transformer 33 acts as a current transformer rather than a voltage transformer. This simplified circuit is described to better understand the current transformer operation of the later described FIGS. 2 through 5 embodiments of the invention. The FIG. 1 circuit consists of a voltage signal source 35 connected to the primary winding 37 of transformer 33 through series resistor 39 having a resistance value, Ri, which is relatively high so that the transformer input is driven by an effective current source. In the circuit connected to the transformer's secondary winding 38 there is a high gain operational amplifier 41 having a negative feedback resistor 43 (with a resistance value Rf) which feeds back the output 45 of the operational amplifier to its inverting input 40. By connecting the inverting and non-inverting inputs 40, 42 of the operational amplifier 41 across the transformer's secondary winding 38, the voltage across secondary winding will be kept very low by virtue of the negative feedback from the amplifier's high gain output 45 thereby driving the voltage at the inverting input to that of the non-inverting input: the amplifier inputs will look like a virtual short circuit. The voltage at the circuit output 47 will be determined by the ratio of the feedback and input resistances Rf. Ri. Specifically, the output voltage at 47, assuming the transformer turn ratio is unity, can be expressed as follows:

$$\frac{Vo}{Vi} = \frac{Rf}{Ri}$$

where the Vo is the voltage output at 47 and the Vi is the voltage of the voltage input signal 35. Functionally, this circuit, which effectively provides a current transformer coupling means between the voltage input and voltage output, can be described as having a voltage-to-current conversion means, achieved by the high resistance input resistor, Ri; a current-to-current transformer which is the transformer 33 loaded by the virtual short circuit at the input of the operational amplifier 41; and a current-to-voltage conversion means which is the operational amplifier circuit in the negative feedback configuration.

From the above simplified circuit of FIG. 1, the embodiments of the invention illustrated in FIGS. 2 and 3 can now be described. FIG. 2 shows, in a functional block diagram form, an ohmically isolated input circuit employing two magnetically isolated transformers connected as shown in FIG. 3 which operate as current-to-current transformers rather than voltage-to-voltage transformers. This produces a very advantageous circuit in that an ohmically isolated circuit can be provided using small, relatively inexpensive transformers which otherwise cannot practically be used. Due to the very small signal levels of the current transformer of the circuit, the transformers will no longer be operating in non-linear regions of a hystersis curve produced by large voltage excursions, and will therefore no longer be a source of appreciable signal distortion.

With further reference to FIG. 2, the transformer coupled input circuit is seen to have input terminals (1, 2 and 3) that are connected to the circuit output 51 via a first circuit branch 53 and a second circuit branch 55 and a differential amplifier 58 which receives the outputs of the two circuit branches. Each of the circuit branches 53, 55 has a voltage-to-current conversion means 57, 59 which receives voltage signal inputs from the input terminals 1, 2, 3, and which is connected to one of the current-to-current transformers 61, 63. The current-to-current transformer of each branch is in turn connected to the current-to-voltage conversion means 65, 67. The two circuit branches are then inputted to the differential amplifier 58 which will produce an output at 51 across the output terminal 69 and ground 71.

Considering now the operation of the FIG. 2 circuit, the input voltage signal applied across terminals 1 and 3 will be conducted through the first circuit branch 53 to the non-inverting input 73 of the differential amplifier 58, while a signal input applied across input terminals 1 and 2 will be conducted through the second circuit branch 55 to the inverting input 75. In either of the above cases, when the signal is conducted through one branch, no signal is conducted through the opposite circuit branch and the differential amplifier 58, assuming unity gain throughout the circuit, will produce an output voltage equal to the input voltage, with the polarity output depending on which circuit branch is conducting. If, on the other hand, the input voltage is applied across input terminals 2 and 3, the two circuit branches 53, 55, will act as a voltage divider and, given equal impedances for each circuit branch, half the input signal will be conducted through the first circuit branch 53 and half the input signal will be conducted through second circuit branch 55. With the outputs of the circuit branches, and thus the inputs 73, 75 to the differential amplifier, being of opposite polarities, the outputs from the circuit branches will be added by the difference amplifier, producing the same voltage output at circuit output 51 as in the case where the voltage signal is only conducted through one of the circuit branches Thus, a universal input circuit is provided whereby a voltage signal input to any combination of the three input terminals produces the same voltage output, and by virtue of the current-to-current transformers in the two circuit branches the output is ohmically isolated from the input.

A particular circuit implementation of the FIG. 2 functional block diagram is shown in FIG. 3 wherein the input terminals 1, 2 and 3 are connected to primary windings 77, 79 of magnetically isolated transformers 81, 83. Terminals 3 and 2 are connected to the top of the primary winding 77, 79 through current resistors 85, 87, and the center input terminal 1 is connected at 78 between the primary windings where they are serially connected.

The circuit on the secondary winding side of the transformers 81, 83 is referenced to "Common." The secondary windings 89, 91 of each of the circuit branch transformers 81, 83 are connected to identical operational amplifiers having a high negative feedback configuration whereby each branch of the circuit operates in the manner of the FIG. 1 circuit described above. As above-described, each of the operational amplifiers 93, 94 will cause their respective transformers to operate at very low signal levels. It will be noted that in the FIG. 3 circuit additional feedback capacitances 95, 97 (Cf) are added to the operational amplifier feedback circuit. The values of these feedback capacitances are chosen to provide high frequency cut-off which will compensate for stray capacitances in the transformer. The operational amplifier circuits 93, 94 also act as a current-to-voltage conversion device for inputting voltage signals from the separate current branches to the difference amplifier 99. The difference amplifier 99 acts to sum the outputs from the operational amplifiers 93, 94 as described above in connection with the FIG. 2 circuit, with the gain of the difference amplifier being determined by the relative values of resistances R1, R2, R3, R4. The circuit output 101 will reflect the summing of the opposite polarity inputs to the difference amplifiers, with an inverted output 103 being suitably provided by an inverter 105.

The FIG. 3 circuit can suitably be constructed using inexpensive transformers with the following circuit element values: Ri, Rf, R1, R2, R3, R4, R5, R6=10,000 ohms; R7, R8=100 ohms; and C1, C2=120 picofarads. Transformers with a turn ratio of 1 to 2.22 have been suitably used.

Referring now to the single transformer embodiment of the invention illustrated in FIGS. 4 and 5, the ohmically isolating input circuits shown therein have an input side 111 connected to an output side 113 by means of a current transformer coupling means which includes a single transformer 115 having a center tapped primary winding 117 connected to the three circuit input terminals 1, 2, 3 (also identified in the drawings as, respectively, "Common," "In−," and "In+") So connected the following primary winding circuits can be defined the primary winding circuit formed by the outer leads 119, 121 connected to the "In+" and "In−" input terminals; the primary winding circuit for the upper half of the primary winding formed by outer lead 119 and the center tap lead 123 connected, respectively, to the "In+" and "Common" input terminals; and the primary winding circuit for the lower half of the primary winding circuit formed by the outer lead 121 and center tap lead 123 connected, respectively, to the "In−" and "Common" input terminals. Series resistances R1 and R2 in the primary winding circuits are series connected to the transformer's outer leads 119, 121.

On the output side of the circuit of the FIG. 4 and FIG. 5 circuits, the secondary winding of transformer 115 is connected directly into the input of a high-gain negative feedback circuit 125. This high-gain negative feedback circuit consists of operational amplifier 127 with a feedback resistance R3 which feeds back the output voltage of the operational amplifier (which is also the output voltage at the circuit output 109) to the amplifier's inverting input 129 to provide an amplifier negative feedback loop. Because the input to an operational amplifier is a virtual ground, the high-gain negative feedback circuit 125 will serve as a virtual zero impedance load means forcing the center tapped transformer to operate as a current transformer with virtually zero voltage across its secondary winding. Approximately zero volts will also appear across each half of the primary winding of the transformer.

It is noted that in FIG. 4 the secondary winding 118 of the transformer is connected to the input of the operational amplifier through a d.c. blocking capacitor C1.

The current transformer operation of the circuit of FIGS. 4 and 5 can best be understood by noting that the current in the upper half of the primary winding is determined mainly by the voltage from the "In+" input terminal to the "Common" terminal divided by the resistance of resistor R1. In a similar manner, the current in the lower half of the primary winding is determined mainly by the voltage from the "Common" input terminal to the "In−" terminal divided by the resistance of resistor R2 which, because the transformer is a center tapped transformer with an equal number of windings on either side of the center tap, has the same value as resistor R2.

The currents in the upper and lower halves of primary winding 117 add. This total current, divided by the turns ratio of transformer 115, flows through the secondary winding 118 and through the feedback resistor R3. The voltage drop across resistor R3 is the product of the current through the resistor (which is also the current in the secondary winding 118) and the resistance of that resistor. Since the end of the resistor R3 connected to the inverting input of the operational amplifier 127 is a virtual ground, the entire voltage across feedback resistor R3 appears as the output voltage at the circuit output 109. The feedback capacitance Cf across feedback resistor R3 provides a high frequency cut-off which will compensate for strong capacitances in the transformer.

Voltage gain between the three different possible terminal pairs and the circuit output can be indicated as follows: voltage gain from input terminals "In+"/"Common" to the circuit output is $R3/nR1$ where n is the turns ratio of transformer 115; and the voltage gain from "In−"/"Common" to the circuit output is $-R3/nR2$. Since the resistance of R2 is equal to the resistance of R1 the magnitude of the voltage gains from the upper half or lower halves of the transformer 115 is the same.

If the input voltage is applied from "In+" to "In−," a current flows through the two resistors R1 and R2. Since the resistance of the resistors is equal, the magnitude of the current is one-half of what it would have been if only one resistor were in the circuit. This current flows through both halves of the primary winding of the transformer 115 and hence induces twice as much current in the secondary winding as it would if it had flowed through only one half of the primary winding. Therefore, the lower current is exactly outset by the greater number of primary winding turns through which it flows and the magnitude of the voltage gain from "In+"/"In−" to the circuit output 109 is the same as from "In+"/"Common" or "In−"/"Common" to the circuit output.

To observe what happens if an unused terminal is shorted to "Common," consider an input voltage applied from "In+" to "Common" and at the same time connecting the "In−" input an "Common" terminals together. The input voltage signal will in this instance cause a current to flow through resistor R1 and through the upper half of the primary of the transformer. Since the secondary of the transformer is connected to a virtual ground, the voltage across the secondary will, as above described, be approximately zero volts, as will the voltage across each half of the primary windings of the transformer. Consequently, when the input terminal "In−" is connected to "Common," essentially zero current will flow through the lower primary winding circuit which includes the center tap lead 123, outer lead 121, and resistor R2, because there is no voltage source in this circuit. Therefore, the voltage gain from input terminals "In+"/"Common" to the circuit output 109 will not substantially change when "In−" is connected to "Common" or disconnected from "Common."

In a similar manner, the voltage gain from the input terminal pair "In−" and "Common" to the circuit output 109 will not substantially change when "In+" is connected to "Common" or is disconnected from "Common."

While the transformer of the FIGS. 4 and 5 circuits is described above as a center tapped transformer it will be understood that the circuit is not intended to be limited to a center tap as opposed to an off-center tap. The resulting change in the turn ratio in the primary winding can be compensated for by suitably varying the relative resistance values for primary winding circuit resistors R1 and R2.

FIG. 5 of the drawings illustrates an alternative embodiment of the circuit of FIG. 4 wherein the relatively large (approximately 100 microfarads or more) and expensive d.c. blocking capacitor C1 is substituted by a feedback circuit 131 connected from the circuit output to the positive input of the operational amplifier. This circuit acts to inhibit the amplification of the operational amplifier's d.c. outset voltage and uses less expensive circuit components as compared to the relatively expensive large d.c. capacitor C1 of FIG. 4. Specifically, in order to reduce the offset voltage, the feedback circuit 131 consists of a servo circuit comprised of an operational amplifier 133, resistances R4, R5, R6, and the negative feedback capacitance C2. Circuit 131 acts as an integrator for integrating the d.c. component of the voltage signal at the output of operational amplifier 127, and feeding the inverted integrated signal back to the positive input to the amplifier. Since the capacitor C2 in the servo circuit 131 is a relatively small, inexpensive capacitor (approximately one microfarad) the servo circuit in its entirety can be provided at less expense than a simple large d.c. blocking capacitor.

Suitable circuit component values for implementing the circuits of FIGS. 4 and 5 are: R1, R2, and R3=5000 ohms; R4 and R5=100,000 ohms; R6=50 ohms. In the FIG. 5 circuit a capacitance of 1 microfarad for C2 will provide a time constant for servo circuit 131 of 0.1 seconds which is long in relation to audio frequencies.

FIG. 6 illustrates various input connections for an input connector having pins numbered 1, 2 and 3 of the FIGS. 2–5 input circuits. It can be seen from the table of FIG. 6 that the input circuits can receive a connector wired with any pin convention and with a balanced or unbalanced signal source output configuration. The positive signal can be assigned to any of the three pin connections and the remaining pins can be connected in the variety of configurations shown in the table, for example, with a balanced signal source output, one pin would be positive and at least one of the other pins would be negative. The remaining third pin could be either tied to negative, common, or not connected. With an unbalanced signal source output connected to the input circuit, the signal would be referenced to common and either two pins would be common or one pin would be common and the other pin not connected. Generally, connecting the signal source across pins 2 and 3 would provide the best performance in terms of common mode rejection and reduction of hum, however, any of the foregoing combinations of input connections would yield either a positive or negative output voltage with identical voltage gains.

Therefore, it can be seen that the present invention provides a unique ohmically isolating input circuit which allows great freedom in making input connections to the circuit from a variety of three conductor signal source output configurations without having to modify the circuits involved and wherein equipment following different output pin connector conventions can be connected together without difficulty. The circuit can be implemented from relatively inexpensive parts, and particularly can be implemented using a single, relatively inexpensive center tapped transformer, which the circuit forces to operate as a current transformer. Although the present invention is described in considerable detail in the foregoing specification, it will be understood that it is not intended that the invention be limited to such detail, except as necessitated by the following claims.

What I claim is:

1. An ohmically isolating input circuit comprising
an input side and an output side,
said input side including at least three input terminals for receiving an input signal across any two of said terminals,
said output side including a single circuit output for providing an output voltage, and
current transformer coupling means for ohmically isolating the input side from the output side of said circuit and for transformer coupling any two of said input terminals to said single circuit output such that the signal gain between said any two input terminals and said circuit output is substantially the same regardless of the two input terminals selected, said current transformer coupling means acting to take the input signal from said any two input terminals and transformer couple same from the input to the output side of said circuit in the form of a small current signal, and said current transformer coupling means further acting to convert said small current signal to a voltage signal at said circuit output.

2. The ohmically isolating input circuit of claim 1 wherein said current transformer coupling means includes transformer means having a primary winding side and a secondary winding side, and a virtual zero impedance load means connected to the secondary winding side of said transformer means to cause said transformer means to operate as a current transformer whereby there is essentially no voltage drop across said transformer means.

3. The ohmically isolating input circuit of claim 2 wherein said load means includes an active high gain negative feedback circuit, the input of which presents a virtual short to the second winding side of said transformer means and which converts the small current signal coupled through said transformer means to an amplified voltage signal.

4. The ohmically isolating input circuit of claim 2 wherein said circuit transformer means includes a single transformer having a tapped primary winding defining at least three different primary winding circuits and wherein means are provided for connecting said three signal input terminals across different primary winding circuits of said transformer whereby input signals applied across different pairs of said input terminals ar applied across different ones of said primary winding circuit and whereby the small current signals couple through said transformer are of approximately the same magnitude regardless of which two input terminals receive said input signal and regardless of whether unused input terminal pairs are shorted.

5. The ohmically isolating input circuit of claim 4 wherein said input terminals receive an input voltage signal and wherein the connecting means for said three signal input terminals include means for converting said voltage signal to a current signal.

6. The ohmically isolating input circuit of claim 4 wherein said tapped transformer is a center tapped transformer.

7. The ohmically isolating input circuit of claim 3 wherein said active high gain negative feedback circuit includes means for inhibiting the amplification of d.c. offset voltages appearing at the input thereof.

8. An ohmically isolating input circuit comprising
an input side and an output side,
said input side including at least three input terminals for receiving an input signal across any two of said terminals,
said output side including a single circuit output for providing a output voltage,
current transformer coupling means for ohmically isolating the input side from this output side of said circuit, said current transformer coupling means including
(a) a single transformer having a secondary winding side and a tapped primary winding side defining three primary winding circuits, said three input terminals being connected across different ones of said three primary winding circuits,
(b) means connected in the primary winding circuits of said tapped transformer for approximately equalizing the signal gain through said transformer from any of said primary winding circuits,
(c) a virtual zero impedance load means connected to the secondary winding side of said transformer to cause said transformer to operate as a current transformer with virtually no voltage drop thereacross, and
(d) means for converting a current signal from the secondary winding side of said transformer to a voltage signal at said single circuit output.

9. The ohmically isolating input circuit of claim 8 wherein said tapped transformer is a center tapped transformer.

10. The ohmically isolating input circuit of claim 8 wherein said load means and means for converting a current signal to voltage signal at said circuit output includes an active high gain negative feedback circuit the input of which presents a virtual short to the secondary winding signal of said transformer.

11. The ohmically isolating input circuit of claim 10 wherein said active high gain negative feedback circuit includes means for inhibiting the amplification of d.c. offset voltages appearing at the input thereof.

12. The ohmically isolating input circuit of claim 8 wherein each of said primary winding circuits is characterized by a turn ratio between the tapped primary winding side and the secondary side of said transformer, and wherein said signal gain equalization means is comprised of resistances in said primary winding circuits which attenuate the current signals therein in correspondence to said transformer turn ratio whereby differentials in gain through said tapped transformer from different primary winding circuits are offset by signal attenuation by said resistances.

13. An ohmically isolating input circuit comprising an input side and an output side,
said input side including at least three input terminals for receiving an input signal across any two of said terminals,
said output side including a single circuit output for providing a circuit output voltage,
a single transformer for ohmically isolating the input side from the output side of said circuit, said transformer comprising
a secondary winding,
a tapped primary winding,
outer primary winding leads providing inputs across said tapped primary winding, and
a tapping primary winding lead providing a tapped input to said primary winding between said outer primary lead inputs,
each of said outer and tapped primary winding leads being in electrical connections with different ones of said input terminals to define three primary winding circuits,
means connected in said primary winding circuits for approximately equalizing the signal gain through said transformer from any of said primary winding circuits,
a virtual zero impedance load means connected to the secondary winding of said tapped transformer to cause said transformer to operate as a current transformer with virtually no voltage drop thereacross,
means for converting a current signal from the secondary winding of said transformer to a voltage signal at said single circuit output.

14. The ohmically isolating input circuit of claim 13 wherein said means for equalizing said signal gain through said transformer includes series resistances in both outer primary winding leads of said transformer which act to attenuate a current signal in the primary winding circuit formed by said outer primary winding leads to a greater degree than a current signal in a primary winding circuit formed by one of said outer primary winding leads and said tapping primary winding lead.

15. The ohmically isolating input circuit of claim 14 wherein said tapping primary winding lead provides a center tap dividing said primary winding into substantially equal halves and wherein the resistance in each of said outer primary winding leads are substantially equal.

16. The ohmically isolating input circuit of claim 14 wherein said input signal is a voltage signal and wherein the resistance is the outer primary winding leads of said transformer are sufficiently large to provide a small current signal in said primary winding circuits.

* * * * *